(12) United States Patent
Bhosle

(10) Patent No.: US 10,462,889 B2
(45) Date of Patent: Oct. 29, 2019

(54) ELECTRICAL PULSE GENERATOR

(71) Applicant: CLARTEIS, Valbonne-Sophia Antipolis (FR)

(72) Inventor: Sounil Bhosle, Lherm (FR)

(73) Assignee: CLARTEIS, Valbonne—Sophia Antipolis (FR)

( * ) Notice: Subject to any disclaimer, the term of this patent is extended or adjusted under 35 U.S.C. 154(b) by 0 days.

(21) Appl. No.: 16/326,740

(22) PCT Filed: Aug. 24, 2017

(86) PCT No.: PCT/FR2017/052271
§ 371 (c)(1),
(2) Date: Feb. 20, 2019

(87) PCT Pub. No.: WO2018/037192
PCT Pub. Date: Mar. 1, 2018

(65) Prior Publication Data
US 2019/0200444 A1    Jun. 27, 2019

(30) Foreign Application Priority Data

Aug. 25, 2016    (FR) ...................................... 16 57935

(51) Int. Cl.
| | |
|---|---|
| H05H 1/24 | (2006.01) |
| H03K 3/012 | (2006.01) |
| H03K 19/20 | (2006.01) |
| H03K 3/037 | (2006.01) |

(52) U.S. Cl.
CPC ........... *H05H 1/2406* (2013.01); *H03K 3/012* (2013.01); *H03K 3/037* (2013.01); *H03K 19/20* (2013.01)

(58) Field of Classification Search
CPC ...... H05H 1/2406; H03K 3/037; H03K 3/012; H03K 19/20

USPC .................................................... 315/111.21
See application file for complete search history.

(56) References Cited

U.S. PATENT DOCUMENTS 5,831,394 A    11/1998    Huber et al.

FOREIGN PATENT DOCUMENTS

| EP | 0781078 B1 | 3/2002 |
|---|---|---|
| EP | 2 389 047 A1 | 11/2011 |
| WO | 2009/022804 A2 | 2/2009 |

OTHER PUBLICATIONS

International Search Report for International Application No. PCT/FR2017/052271 dated Nov. 28, 2017.
Written Opinion for International Application No. PCT/FR2017/052271 dated Nov. 28, 2017.

(Continued)

*Primary Examiner* — Don P Le
(74) *Attorney, Agent, or Firm* — Pearne & Gordon LLP

(57) ABSTRACT

The invention relates to a pulse generator comprising an inductor that is intended to store energy that is delivered, during a charge phase, by a DC voltage source to two power supply terminals of the generator, and to transfer the energy to the dielectric-barrier discharge device during a discharge phase via a transformer, the generator further comprising:
an arrangement of a first and of a second circuits in series that are connected at a node N of the generator;
the first circuit comprising two branches, one of the two branches comprising the inductor, and the other branch comprising a diode and the transformer, the secondary being connected to the dielectric-barrier discharge device;
the second circuit comprising a controlled switch.

14 Claims, 13 Drawing Sheets

(56) References Cited

OTHER PUBLICATIONS

Preliminary French Search Report for French Application No. 1657935 dated Mar. 31, 2017.
Kogelschatz et al., "Dielectric-Barrier Discharges. Principle and Applications." Journal de Physique IV Colloque, 1997, 07, pp. C4-47-C4-66, ABB Corporate Research Ltd., Baden, Switzerland.
Piquet et al., "Pulsed Current-Mode Supply of Dielectric Barrier Discharge Excilamps for the Control of the Radiated Ultraviolet Power." IEEE Transactions on Plasma Science, Institute of Electrical and Electronics Engineers, Oct. 2010, pp. 1-10, vol. 38, No. 10, IEEE.

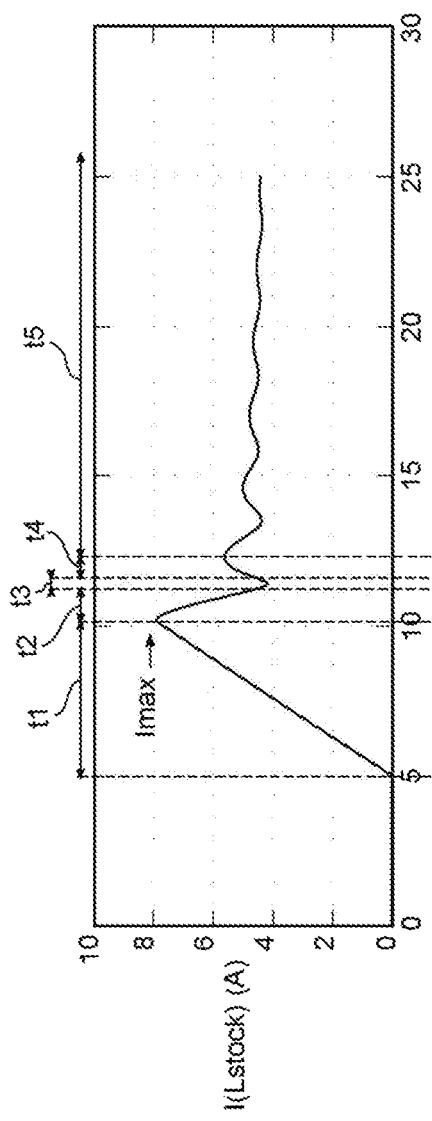
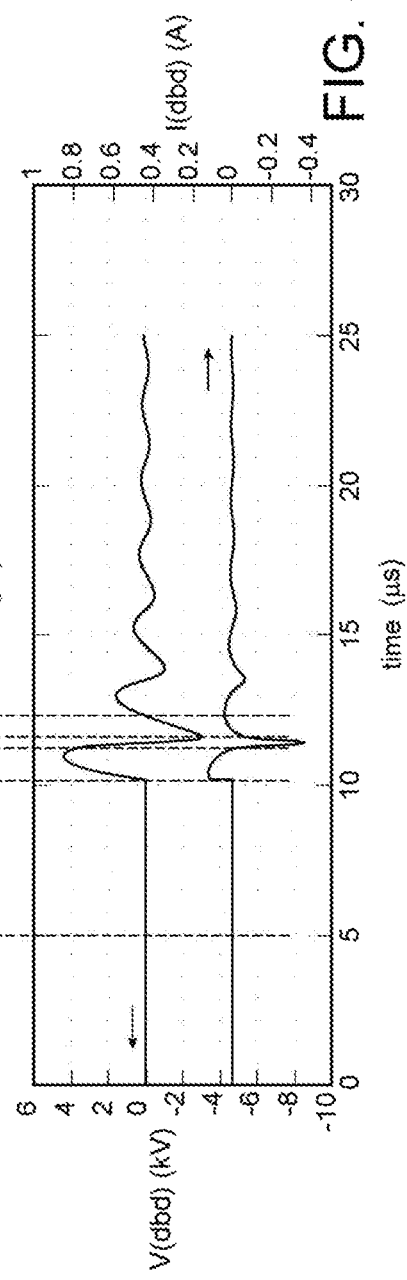

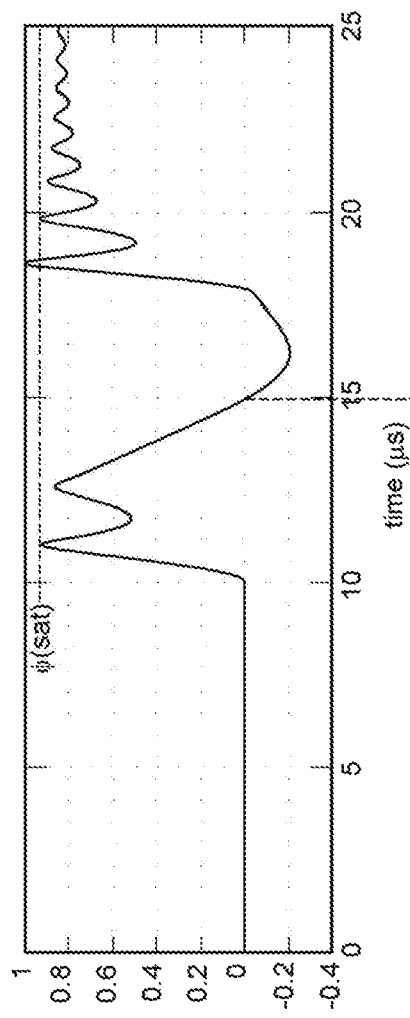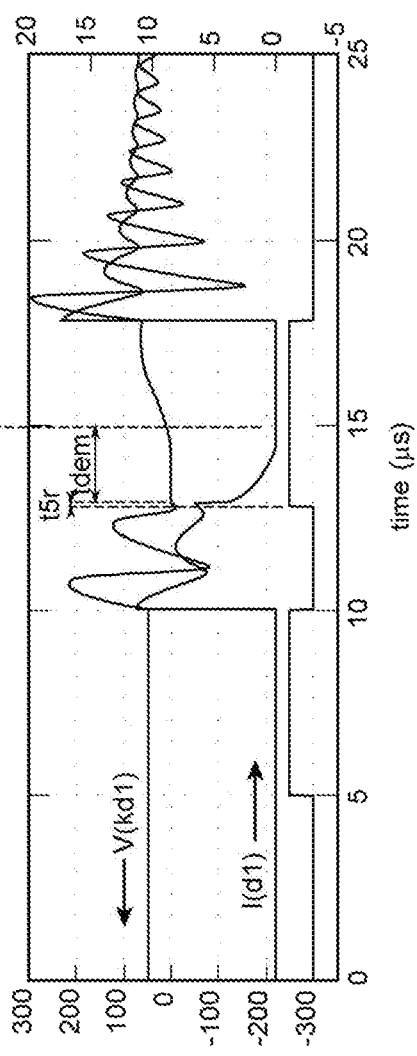

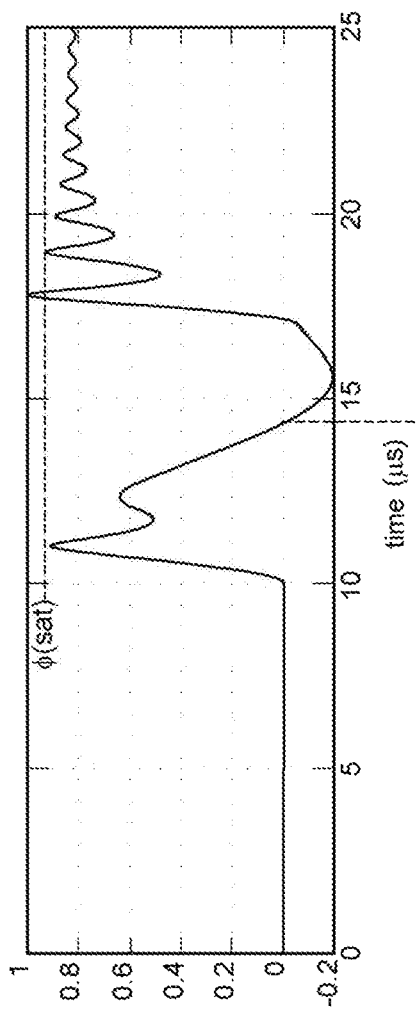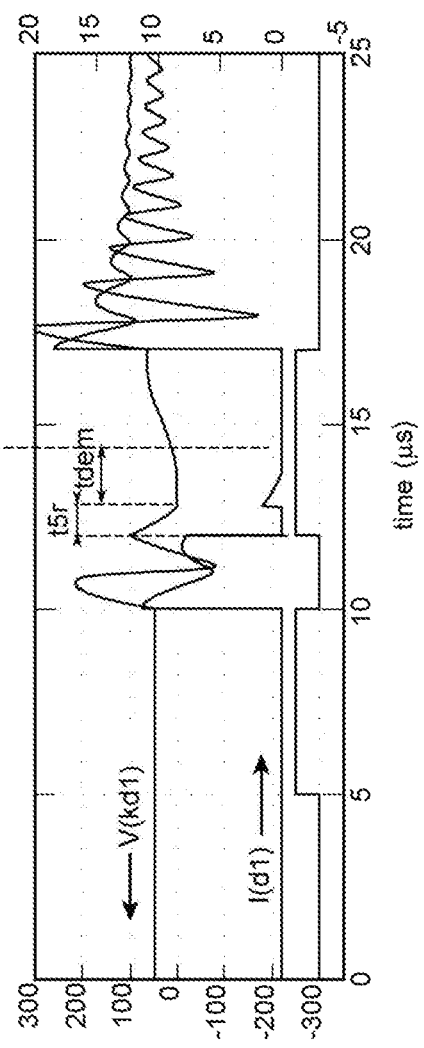

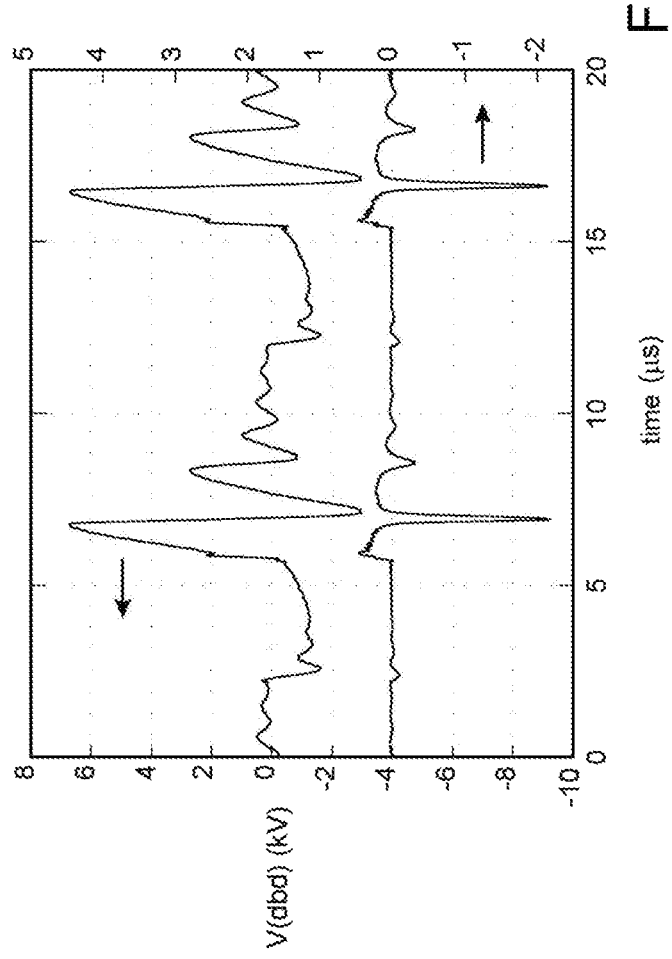

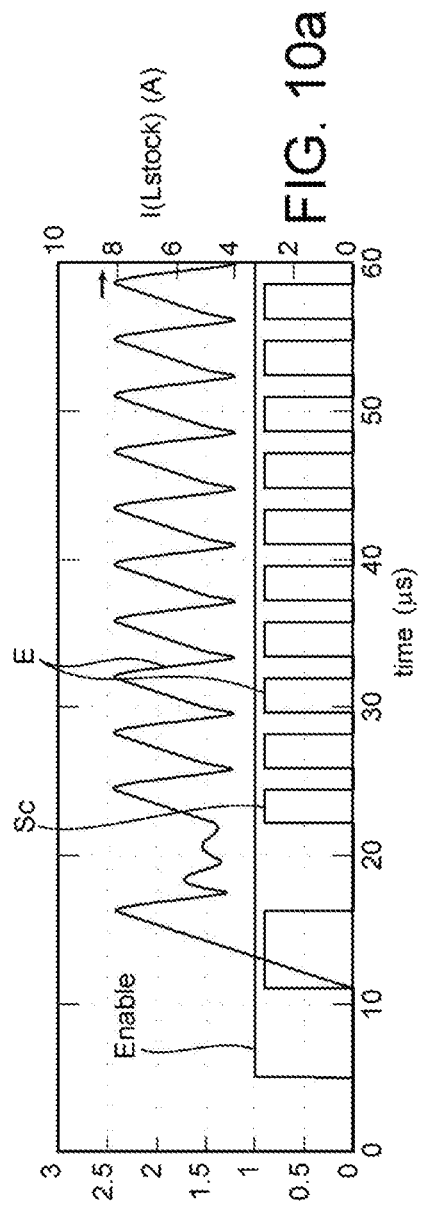
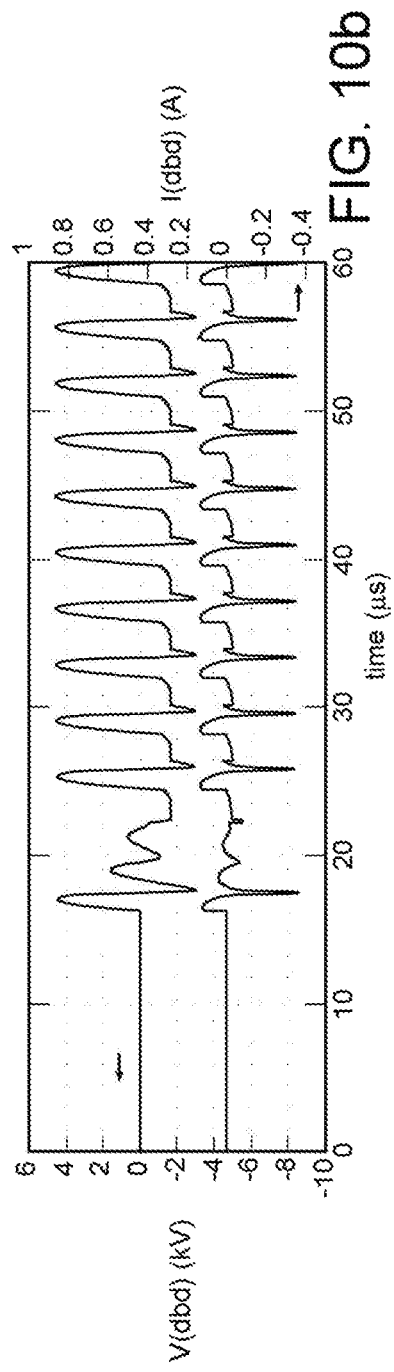

ELECTRICAL PULSE GENERATOR

TECHNICAL FIELD

This relates to an electrical pulse generator intended to power a dielectric-barrier discharge device.

PRIOR ART

Dielectric-barrier discharges represent a technology that is particularly interesting for generating a plasma.

In this respect, FIG. 1 shows an example of the device 1 suitable for generating a dielectric-barrier discharge within a gas placed between two electrodes 2 and 3 (note however that generating dielectric-barrier discharges is not limited to the device shown in FIG. 1). The device 1 is, furthermore, provided with a dielectric material 4, in this case, in contact with one of the two electrodes 2 and 3. Thus, when the gas is subjected to a voltage V, greater than its breakdown voltage $V_C$ and imposed by the two electrodes 2 and 3, a dielectric-barrier discharge can be observed. However, during the discharge, the dielectric material, which is insulating by nature, blocks the charges, and creates an electric field that opposes the electric field imposed by the two electrodes 2 and 3, thus providing a transient nature to the discharge. This transient nature makes it possible to generate a plasma in a state referred to as "out of thermodynamic equilibrium" which has many applications, at a temperature close to the ambient temperature and in a broad range of pressures including atmospheric pressure. In particular, such plasmas can be used for treating surfaces, physical-chemical methods or for producing light radiation. Those skilled in the art will find a description of the potential applications of dielectric-barrier discharges in the document [1] mentioned at the end of the description.

However, in order to produce and maintain a dielectric-barrier discharge, it is necessary to implement a generator that makes it possible to impose a voltage V, greater than the breakdown voltage $V_C$ of the gas, periodically. Indeed, the dielectric-barrier discharge being by nature a transient phenomenon, this discharge must be re-primed periodically in such a way that the plasma produced appears stable on the average.

Moreover, increasing interest is observed in applying to dielectric-barrier discharges a voltage V with a pulse shape (hereinafter called an electrical pulse) rather than a sinusoidal shape (the term pulse voltage means a voltage that has a rising edge and a falling edge having abrupt slopes).

The document [2] mentioned at the end of the description presents a generator suitable for generating periodic electrical pulses. The document [2] presents an original topology that makes it possible to send an abrupt voltage pulse, through the discharge of a capacitor in the dielectric-barrier discharge, then a circuit for recovering the energy that is not consumed in the discharge. This topology makes it possible to generate regular wave forms and devoid of parasite oscillations.

This device is not however satisfactory.

Indeed, the substantial current generated during this discharge is limited only by parasite elements of the circuit, in particular, the resistance of the winding and the leakage inductance of the generator. These elements are difficult to control.

Moreover, the generator proposed, during operation, abruptly places a storage capacitor in contact with the dielectric-barrier discharge. This results in a substantial peak current passing through the power switch that has to be dimensioned in order to support said peak current.

Furthermore, the energy recovery circuit, provided with high-voltage diodes, must make it possible to allow a recovery current to pass which can be substantial. Such high-voltage diodes are expensive elements that thus limit their interest in such applications.

Finally, the generator comprises power switches, generally, subjected to substantial current during discharge cycles that induce high losses during the switching thereof. These switching losses render the control of the switches complicated and can require oversizing said switches.

A purpose of this invention is then to propose an electrical pulse generator intended to power a dielectric-barrier discharge device, and that makes it possible to limit the switching losses observed in generators of the state of the art.

Another purpose of this invention is to propose an electrical pulse generator that is compact and light, which does not require the oversizing of these constituent elements, and which thus makes it possible to reach a manufacturing cost that is compatible with the industrial requirements.

DISCLOSURE OF THE INVENTION

The purposes of the invention are thus in part achieved by an electrical pulse generator intended to power a dielectric-barrier discharge device, the generator comprising an inductor intended to store energy that is delivered, during a charge phase, by a DC voltage source to two power supply terminals of the generator, and to transfer said energy to the dielectric-barrier discharge device during a discharge phase by the intermediary of a step-up transformer, the generator further comprising:

an arrangement of a first and of a second circuits in series that are connected at a node N of the generator, the first circuit comprising two parallel branches, one of the two branches comprising the inductor, and the other branch comprising, in series, a diode connected by its anode to the node N, and by its cathode to the primary circuit of the step-up transformer, the secondary circuit of the step-up transformer being intended to be connected to the dielectric-barrier discharge device, the second circuit comprising a controlled switch of which the closing and the opening control, respectively, the charge and discharge phases.

According to an embodiment, the second circuit further comprises a diode electrically connected in series with the controlled switch, and connected by its anode to the node N.

According to an embodiment, the step-up transformer also comprises a magnetic core, the electrical pulse generator further comprises the dielectric-barrier discharge device, said dielectric-barrier device comprising a gas that is suitable for generating a dielectric-barrier discharge when a voltage V, greater than an operating voltage $V_D$ of the dielectric-barrier discharge device, is imposed on said device, in such a way that the dielectric-barrier discharge generates a first variation in the magnetic flux, predetermined by the operating voltage $V_D$, through the magnetic core, the magnetic core being dimensioned to magnetically saturate when a variation in the magnetic flux, greater than the first variation in the magnetic flux, passes through it.

According to an embodiment, the generator further comprises a control module suitable for generating a control signal Sc intended to control the opening and the closing of the controlled switch.

According to an embodiment, the control module comprises means for comparing a current Istock passing through the inductor with a reference current Iref, the control signal of the control module controlling the opening of the controlled switch when the current Istock is greater than the current Iref.

According to an embodiment, the means for comparing comprise a first comparator.

According to an embodiment, the control module comprises a flip-flop D comprising an output Sc intended to send the control signal Sc to the controlled switch.

According to an embodiment, the control module is, furthermore, suitable for generating a control signal Sc for closing the controlled switch when an external control signal is received, advantageously, the external control signal is a clock signal H1 with timeslot, and a control signal Sc for closing is generated on each rising edge of the clock signal H1.

According to an embodiment, the external control signal is sent to an input C of the flip-flop D, the comparison of the current Istock with the reference current Iref is sent to the input D and RST# of the flip-flop D.

According to an embodiment, the control module comprises, furthermore, a means for determining the sign of the voltage at the node N, the control module being suitable for generating a control signal Sc that controls the closing of the controlled switch when the voltage at the node N is negative.

According to an embodiment, the means for determining the sign of the voltage is a second comparator.

According to an embodiment, the means for determining the sign of the voltage is connected to the input C of the flip-flop D, the means for determining the sign of the voltage being suitable for sending a high state to the input C of the flip-flop D when the voltage V(ad1) at the node N is negative.

According to an embodiment, the control module comprises a logic OR gate interposed between the means for determining the sign of the voltage and the input C of the flip-flop D, the output of the means for determining the sign of the voltage being connected to an input of the logic OR gate, and a priming generator being connected to a second input of the logic OR gate, the priming generator being suitable for generating a so-called "high" state at the input of the logic OR gate.

According to an embodiment, the control module further comprises a logic AND gate interposed between the means for comparing and the input D of the flip-flop D, the logic gate comprising a first input supplied by the means for comparing and a second input supplied by a signal, the logic AND gate supplying the input D of the flip-flop D, the logic AND gate being suitable for sending a high signal to the input D when the current Istock is greater than the reference current Iref and the signal is also high, and a low ENABLE signal that makes it possible to stop the electrical pulse generator.

BRIEF DESCRIPTION OF THE DRAWINGS

Other characteristics and advantages shall appear in the following description of the electrical pulse generator according to the invention, provided as non-limiting examples, in reference to the accompanying drawings wherein:

FIG. 4a is a graphical representation obtained via digital simulation of the intensity of the current passing through the inductor Lstock (on the vertical axis) as a function of time (horizontal axis) during the unfolding of the four operating sequences of the electrical pulse generator, according to the invention, on a single pulse, FIG. 4b is a graphical representation, obtained via digital simulation, of the voltage V(dbd) (left vertical axis) and of the intensity of the current I(dbd) (right vertical axis) as a function of time (horizontal axis) of a dielectric-barrier discharge device supplied by a single pulse delivered by the electrical pulse generator according to the invention, FIG. 5a shows the change in the magnetic flux (along the vertical axis) in the step-up transformer, comprising a magnetic core, as a function of time (the magnetic flux being an indicator of the magnetic state of said transformer) in the context of a closing of the controlled switch T1 for a negative voltage Vkd1, φsat representing the saturation flow of the magnetic core of the transformer, FIG. 5b shows the change in the voltage Vkd1 and the current passing through the diode D1 in the context of a closing of the controlled switch T1 for a negative voltage Vkd1, FIG. 6a shows the change in the magnetic flux (along the vertical axis) in the step-up transformer, comprising a magnetic core, as a function of time (the magnetic flux being an indicator of the magnetic state of said transformer) in the context of a closing of the controlled switch T1 for a positive voltage Vkd1, φsat representing the saturation flow of the magnetic core of the transformer, FIG. 6b shows the change in the voltage Vkd1 and the current I(d1) passing through the diode D1 in the context of a closing of the controlled switch T1 for a positive voltage Vkd1, FIG. 7 diagrammatically shows the topology of a control module intended to control the controlled switch T1 according to control strategy with limited current, FIG. 8c is a graphical representation, of an experimental implementation of the electrical pulse generator according to the invention, in the context of a control strategy with limited current, with the graph showing the current I(dbd) (right vertical axis) passing through the dielectric-barrier discharge device, as well as the voltage V(dbd) (left vertical axis) at the terminals of said device, as a function of time (horizontal axis), FIG. 9 diagrammatically shows the topology of a control module intended to control the controlled switch T1 according to an optimum power control strategy, FIG. 10a is a graphical representation, of a digital simulation of the operation of the electrical pulse generator according to the invention, in the context of the optimum power control strategy, with the graph showing the current Istock passing through the inductor Lstock (right vertical axis), and the control signal Sc generated by the flip-flop D (left vertical axis) and sent to the controlled switch T1, as a function of time (horizontal axis), FIG. 10b is a graphical representation of a digital simulation of the operation of the electrical pulse generator according to the invention, in the context of an optimum power control strategy, with the graph showing the current I(dbd) (right vertical axis) passing through the dielectric-barrier discharge device, as well as the voltage V(dbd) (left vertical axis) at the terminals of said device, as a function of time (horizontal axis)

DETAILED DISCLOSURE OF PARTICULAR EMBODIMENTS

The invention described in detail hereinbelow implements an electrical pulse generator intended to power a dielectric-barrier discharge device. As shall be seen in the rest of the description, the generator according to the invention comprises an inductor Lstock intended to store energy, during a charge phase, supplied by a DC voltage source, and to restore the energy in the form of a pulse to a dielectric-barrier discharge device by the intermediary of a step-up transformer. It shall also be seen, under certain conditions, that such an electrical pulse generator makes it possible to recover the energy that is not consumed by the dielectric-barrier discharge device without involving the switching of power switches.

Figure 1:
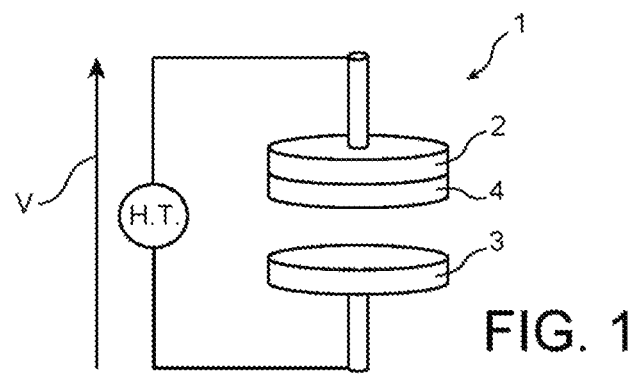
FIG. 1 diagrammatically shows a dielectric-barrier discharge device able to be supplied by the electrical pulse generator according to the invention.
Figure 2:
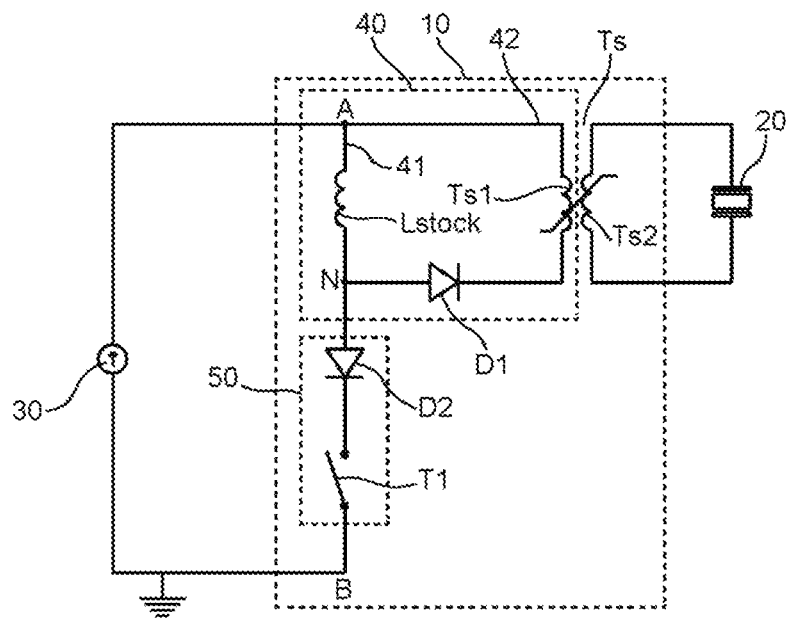
FIG. 2 is a representation of a simplified topology of the electrical pulse generator according to an advantageous embodiment of the invention, FIGS. 3a, 3b, 3c and 3d diagrammatically show current loops flowing in the electrical pulse generator according to the invention, more particularly.

FIG. 2 diagrammatically shows the electrical pulse generator 10 according to the invention.

The electrical pulse generator 10 comprises two power supply terminals A and B intended to be connected to a DC voltage source 30.

The DC voltage source 30 can cover a broad range of voltage, for example voltages between 10 V and 350 V.

More particularly, the DC voltage source 30 can be a very low voltage source between 10 V and 50 V.

The electrical pulse generator 10 comprises an inductor Lstock. The term inductance means a coil formed from a winding of a conducting wire possibly around a core made of ferromagnetic material.

The electrical pulse generator 10 comprises a step-up transformer Ts provided with a primary circuit Ts1 and a secondary circuit Ts2. A step-up transformer generally comprises a magnetic core around which are wound the primary Ts1 and secondary Ts2 circuits.

The inductance Lstock is arranged in such a way as to store an energy supplied, during a charge phase, by the DC voltage source 30, and to transfer said energy, during a discharge phase, to a dielectric-barrier discharge device 20 by the intermediary of the step-up transformer Ts. Thus, the electrical pulse generator 10 also comprises a switching means of which the switching provides the alternation between the charge phase and the discharge phase. Thus, during the charge phase, the switching means is closed in such a way that the voltage delivered by the DC voltage source 30 is imposed at the terminals of the inductor Lstock. During the discharge phase, the switching means is open in such a way that the inductor Lstock is insulated from the DC voltage source 30. Thus, during the discharge phase, the inductor Lstock transfers the energy stored by generating a current I(d1) in the primary circuit Ts1 (in other words a current loop is formed between the inductor Lstock and the primary circuit Ts1).

The switching means can include a controlled switch T1, more particularly the controlled switch T1 can be a power switch, for example an insulated gate field effect transistor ("Metal Oxide Semiconductor Field Effect Transistor", or "MOSFET").

The electrical pulse generator 10 is also provided with a diode D1.

Moreover, the terminals of the secondary circuit Ts2 are intended to impose a voltage and/or a current at the terminals of the dielectric-barrier discharge device 20.

A particular arrangement of the electrical pulse generator 10 given as a non-limiting example shall now be described.

The electrical pulse generator 10 comprises a first circuit 40 and a second circuit 50 electrically connected in series at the level of a node N.

The first circuit 40 comprises two branches 41 and 42 each connecting the node N and the terminal A of the electrical pulse generator 10. It is thus understood that the two branches 41 and 42 are connected in parallel.

The first circuit 40 is advantageously devoid of switching means.

The branch 41 comprises the inductor Lstock.

The branch 42 comprises the diode D1 connected in series, by its cathode, to the primary circuit Ts1 of the step-up transformer Ts. The anode of the diode D1 is connected to the node N.

The second circuit 50, connecting the node N and the terminal B, comprise the controlled switch T1.

Advantageously, the second circuit 50 can also comprise a diode D2 interposed between the controlled switch T1 and the node N, and intended to impose a direction of passing of the current in the controlled switch T1 when the latter is in the closed position. It shall be seen in what follows that the diode D2 can be particularly advantageous when the electrical pulse generator 10 is controlled according to a strategy referred to an "optimum power strategy".

As shall be seen in the rest of the description, only the first circuit 40 is solicited during the discharge phase. This discharge phase, as was able to be described in the "Prior art" section, gives rise to substantial variations in voltage and in current that will be imposed solely on the elements comprising the first circuit 40. More particularly, peak currents occurring during the appearance of the discharge, can be supported only by the secondary circuit Ts2 of the step-up transformer Ts when the magnetic core can be saturated. Indeed, the magnetic core of the transformer Ts can be dimensioned to saturate during the discharge phase. A drop in the values of the inductor L2 of the secondary circuit Ts2 is thus observed. This results in a rupture, at least partially, of the coupling by induction between the primary circuit Ts1 and the secondary circuit Ts2. Thus, during the discharge phase, and particularly advantageously, no current passes through the controlled switch T1 when the magnetic core can be saturated. This is a considerable advantage with respect to the device described in the document [2].

The term saturated magnetic core means a magnetic core that has a magnetic saturation field according to the direction of winding of the secondary circuit Ts2.

The magnetic saturation field is defined as the maximum magnetic field that can be created in the magnetic core.

The dielectric-barrier discharge device is able to generate a dielectric-barrier discharge when a voltage V, greater than a voltage $V_D$, is imposed on its terminals. The voltage $V_D$ depends to the nature of the dielectric material, its form, its positioning in the device 20, and also the breakdown voltage of the gas included in the dielectric-barrier discharge device. The voltage $V_D$ is a characteristic parameter of the dielectric-barrier discharge device 20, and is known to those skilled in the art who can refer to the document [1] mentioned at the end of the description. The voltage $V_D$ is therefore an operating voltage of the dielectric-barrier discharge device 20.

The operating voltage $V_D$ is thus defined as the voltage above which the dielectric-barrier discharge device 20 is able to generate a dielectric-barrier discharge.

During the unfolding of the dielectric-barrier discharge, the magnetic state of the magnetic core (i.e.: the magnetic field within the core) is modified. More particularly, the magnetic state of the core is modified by the variation in the magnetic flux imposed by the voltage at the terminals of the dielectric-barrier discharge device caused by the generation of the dielectric-barrier discharge.

Thus, the variation in the magnetic flux is given by the operating voltage $V_D$ of the dielectric-barrier discharge device 20. Consequently, the knowledge of the operating voltage $V_D$ makes it possible to dimension the magnetic core of the step-up transformer in such a way that said magnetic core is magnetically saturated at the time when the dielectric-barrier discharge is generated.

The dimensioning of the magnetic core in order to make it able to be saturated in the aforementioned conditions of use can include the choice of a specific magnetic material (for example a material of the Ferrite type) and/or the shape of said core, and/or the size of said core.

The dimensioning of the magnetic core in order to render is able to be saturated in the conditions of use imposed by the dielectric-barrier discharge device 20 can include an adjustment of the magnetic section of said magnetic core.

In this respect, those skilled in the art will find all of the required teaching for dimensioning magnetic cores in the document [3] mentioned at the end of the description.

Moreover, the Applicant noticed that a magnetic core with a magnetic section A, less than a magnetic section Amin defined by the equation (1), would be suitable for the implementation of the invention (namely obtaining a magnetic core that can be saturated in the aforementioned conditions of use).

$$A_{min} = \frac{C_{eq1} V_D^2}{2 N_1 I_{max} B_{sat}} \quad (1)$$

where $C_{eq1}$ is the equivalent capacitance of the dielectric material of the dielectric-barrier discharge device, $N_1$ the number of turns of the primary circuit of the step-up transformer Ts, $I_{max}$ the current flowing in the inductor Lstock at the end of the first sequence ($I_{max}$ is defined in the rest of the description), and $B_{sat}$ the value of the magnetic saturation field in the core.

In general, the saturation of the magnetic core of a step-up transformer is an undesirable effect, because the coupling between the primary and secondary circuits is broken.

In the framework of this invention, the breaking of the coupling makes it possible to re-inject a portion of the energy that is not consumed by the dielectric-barrier discharge device into said dielectric-barrier discharge device.

Thus, the voltage at the terminals of the dielectric-barrier discharge device generate an increase in the magnetic flux in the core of the transformer Ts which is dimensioned to saturate starting at a defined value of the voltage at the terminals of the dielectric-barrier discharge.

Moreover, rendering the magnetic core able to be saturated in the operation conditions of the dielectric-barrier discharge device makes it possible to reduce the size of said magnetic core.

In relation with FIGS. 3a to 3d, 4a and 4b, the four (4) operating sequences of the electrical pulse generator 10 on a single electrical pulse shall now be described. It is considered in the rest of the description that the electrical pulse generator comprises the diode D2, and that the magnetic core of the step-up transformer Ts is dimensioned to be magnetically saturated when the dielectric-barrier discharge is generated. In other words, the magnetic core of the step-up transformer is dimensioned with respect to the operating voltage $V_D$ of the dielectric-barrier discharge device.

The first sequence (FIG. 3a) corresponds to the charge phase of the inductor Lstock. During this first sequence, the controlled switch T1 is closed for a time t1. The voltage Vs of the DC voltage source 30 is then imposed on the inductance Lstock. A current loop, of which the intensity Istock increases linearly thus flow in the unit formed by the DC voltage source 30, the inductor Lstock, the diode D2 and the controlled switch T1 (FIG. 4a).

After the time t1, the current Istock reaches the value Imax. The value Imax can be adjusted easily, by modulating the time t1, according to the needs in terms of the wave shape of the voltage and of the current that has to be generated by the electrical pulse generator 10. Consequently, the topology can operate in a broad range of voltage values Vs, since it is sufficient to adapt the charge time t1 according to the desired value for Imax.

After the time t1, the second sequence (FIG. 3b) begins with the opening of the controlled switch T1. The second sequence lasts a time t2. During this second sequence, the energy stored in the inductor Lstock is transferred in a resonant manner to the dielectric-barrier discharge device 20 through the step-up transformer Ts. The dielectric-barrier discharge device acts as a capacitor of which the discharge volume is occupied by a gas. It is thus observed, during the transfer of the stored energy, that the voltage V(dbd) at its terminals increases along a sinusoid portion (FIG. 4b).

Advantageously, the rate of growth of this voltage V(dbd) can be controlled by adjusting the current Imax, and therefore by the duration for closing the controlled switch T1 (in other words the time t1).

When the voltage imposed on the gas contained in the dielectric-barrier discharge device 20 reaches the breakdown voltage $V_C$ (also called ignition voltage) of said gas, the latter is ionised in order to create a transient discharge. The voltage at the terminals of the dielectric-barrier discharge device generates an increase in the magnetic flux in the core of the transformer Ts that is dimensioned to be magnetically saturated starting from a defined value $V_D$ of the voltage at the terminals of the dielectric-barrier discharge, the defined voltage $V_D$ being greater than the breakdown voltage $V_C$ of the gas.

At the end of the second sequence, a saturation of the magnetic core of the step-up transformer Ts takes place, either before the total transfer of the energy from the inductor Lstock to the dielectric-barrier discharge device or after.

Figure 12:
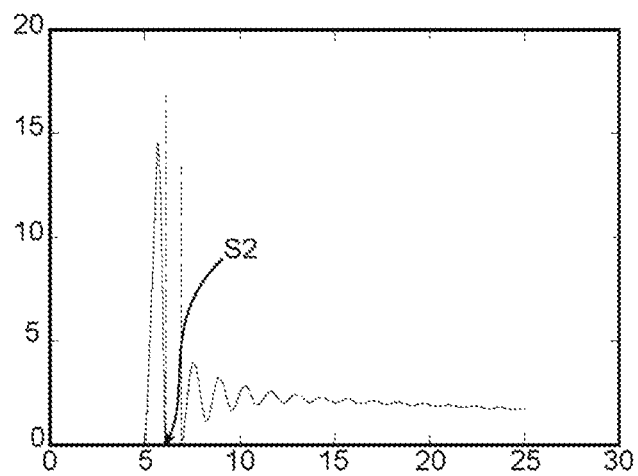
FIG. 12 shows the change in the current Istock (on the vertical axis) as a function of time (on the horizontal axis) in the framework of a total transfer of energy from the inductor Lstock to the dielectric-barrier discharge device according to an embodiment of the invention.

FIG. 12 shows the change in the current Istock (on the vertical axis) as a function of time (on the horizontal axis) in the framework of a total transfer of the energy of the inductor Lstock to the dielectric-barrier discharge device 20. A cancellation of the current Istock is clearly observed at the end of the second sequence (point S2 in FIG. 12)

The third sequence therefore begins with the saturation of the magnetic core of the step-up transformer Ts. Such as described hereinabove, when the magnetic core of the step-up transformer Ts saturates, the value of the inductor L2 of the secondary circuit Ts2 drops (the transformer is transformed into leakage inductance). This results in a rupture, at least partially, of the coupling by induction between the primary circuit Ts1 and the secondary circuit Ts2, in such a way that the current flowing in the loop formed by the inductor Lstock, the diode D1 and the primary circuit Ts1 freely rotates.

Figure 3A:
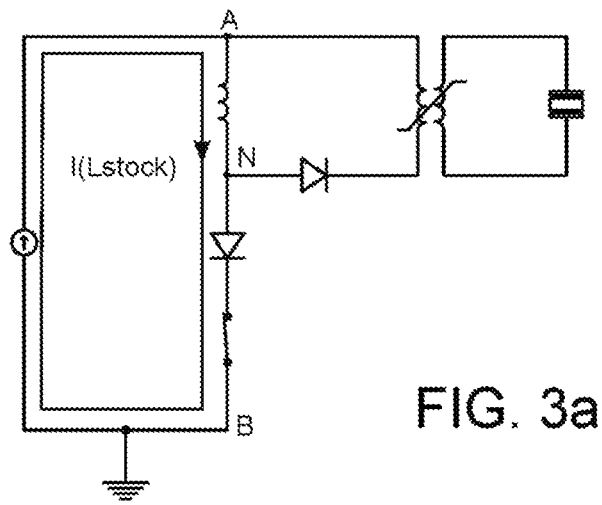
FIGS. 3a, 3b, 3c and 3d show, respectively, the direction of the current loops during first, second, third and fourth sequences.
Figure 3B:
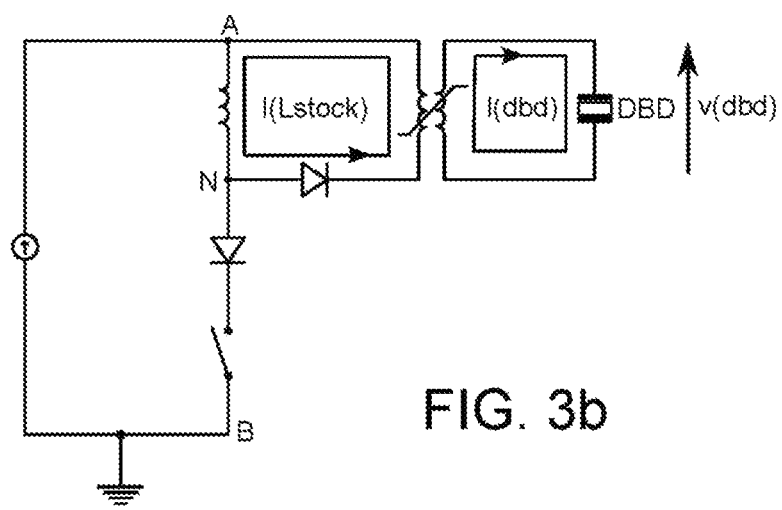
Figure 3C:
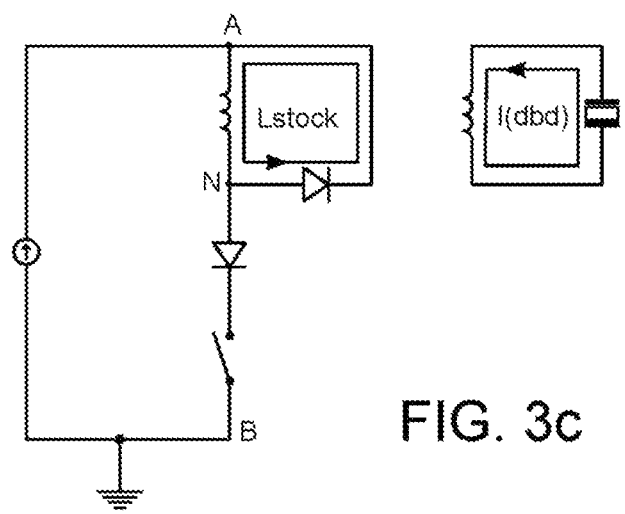
Figure 3D:
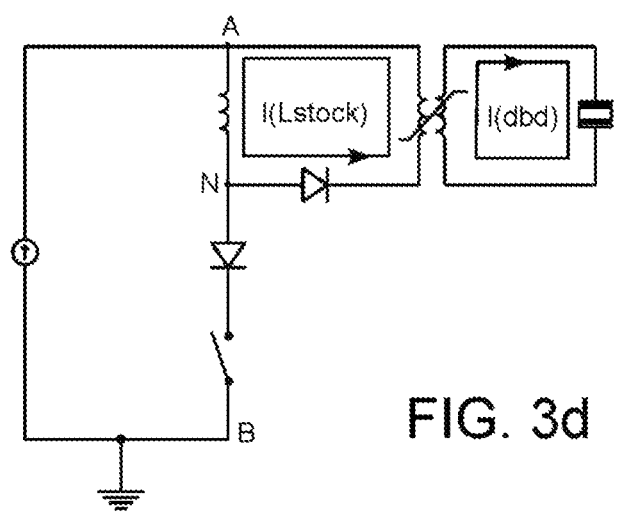

In parallel, the dielectric-barrier discharge device 20 has consumed at least a portion of the stored energy that was transferred top it during the second sequence. A residual energy, that is not consumed, remains stored in the form of charges at the surface of the dielectric or dielectrics of the dielectric-barrier discharge circuit 20. The dielectric-barrier discharge device 20 in parallel with the low inductance formed by the secondary circuit Ts2 (due to the saturation of the magnetic core) thus form a low eigenfrequency dipole. The residual energy is then transferred in a resonant manner between the dielectric-barrier discharge device 20 to the leakage inductance of the step-up transformer Ts that can be saturated for the time t3. An abrupt and brief drop in the voltage V(dbd) is thus observed at the terminals of the dielectric-barrier discharge device 20 (FIG. 3c, and FIG. 4b).

When the transfer of the residual energy to the leakage inductance is carried out, said residual energy is re-injected into the dielectric-barrier discharge circuit 20, also via resonance, and produces a second voltage pulse at the terminals of the dielectric-barrier discharge device 20 with a polarity opposite the first pulse coming from the second sequence. An abrupt drop in the voltage is accompanied by a second discharge, coinciding with a peak current with a direction opposite the first.

The saturation of the magnetic core observed during the third sequence gives rise to an abrupt phenomenon of a decrease in the voltage V(dbd) at the terminals of the dielectric-barrier discharge device 20, and also a current pulse (a peak current) in said device 20 of a large amplitude. Also, contrary to the device described in the document [2], the current peak flows exclusively between the secondary circuit Ts2 and the dielectric discharge device 20. These elements can support without failure this transient overintensity. In particular, the current peak does not pass through the controlled switch T1 and therefore does not require the over-sizing of these components, contrary to the cases mentioned in the state of the art.

The amplitude of the second voltage pulse is generally less (in absolute value) than that of the first. This decrease is at least partially due to the dissipative elements of the circuit. Thus, a low amplitude of the second voltage pulse indicates a good transfer of the energy injected by the inductor in the discharge.

During the third sequence, the direction of the current, circulating in the secondary circuit Ts2 and dielectric-barrier discharge device 20 set, maintains the saturation of the magnetic core of the step-up transformer Ts.

During the fourth sequence, which extends over a time t4, the energy is again entirely stored in the dielectric-barrier discharge device 20, therefore at the maximum (in absolute value) of the second voltage pulse. The energy of the dielectric-barrier discharge device 20 is sent back, by resonance, to the secondary circuit Ts2. However, the direction of the current, inverted with respect to the third sequence (FIG. 3d), desaturates the magnetic core, thus re-establishing the coupling between the primary Ts1 and secondary Ts2 circuits.

The resonant transfer is no longer carried out between the dielectric-barrier discharge device 20 and the secondary circuit Ts2, but between said device 20 and the primary circuit Ts1 in parallel with the inductor Lstock (through D1). The residual energy in the dielectric-barrier discharge device 20 is therefore recovered and distributed between the step-up transformer Ts that can be saturated and the inductor Lstock.

If the controlled switch T1 is not put back into conduction afterwards, the resonance continues between the dielectric-barrier discharge device 20, the step-up transformer Ts that can be saturated and the inductor Lstock. An oscillation in the voltage V(dbd) is then observed at the terminals of the dielectric-barrier discharge device 20. In general, the amplitude of the oscillations in voltage V(dbd) at the terminals of the dielectric-barrier discharge device is not sufficient to prime new discharges in the gas, and the oscillations are damped because of the dissipative parasite elements (in particular the resistors of the primary Ts1 and secondary Ts2 circuits, and the inductor Lstock).

Various cases can then be considered for the closing of the control switch T1.

According to a first case, the controlled switch T1 can be closed after a time greater than the relaxation time of the oscillations in the voltage V(dbd). In this case, the system is in its initial state and this sequence is therefore identical to the sequence 1.

According to a second case, the controlled switch T1 can be closed before the relaxation of the oscillations in the voltage V(dbd).

In this case, the current flowing in the inductor Lstock and the primary circuit Ts1 is not zero (the diode D1 being in a passing state). The anode and the cathode of the diode D1 are at a potential, respectively, V(ad1) and V(kd1), oscillating and centred on Vs.

At the closing of the controlled switch T1, the potential V(kd1) is therefore either positive or negative.

If V(kd1) is negative at the time of the closing of the control switch T1, the diode D2 is in a blocking state. Consequently, the closing of the controlled switch T1 is done with zero current, which prevents the switching losses by switching said controlled switch T1. When the controlled switch T1 is closed, the potential V(kd1) (shown in FIG. 5b) takes a time t5 to pass again through zero, thus providing the diode D2 with a passing state. The voltage at the terminals of the primary circuit is also maintained at the value Vs imposed by the DC voltage source 30, which leads to a demagnetisation of the magnetic core of the step-up transformer Ts after a time tdem (FIGS. 5a and 5b).

On the contrary, if V(kd1) is positive (FIG. 6b) at the time of the closing of the control switch T1, the diode D2 is in a passing state and the closing of T1 imposes a potential on the anode of the diode D1 close to zero, which leads to a blocking of the latter, and to an abrupt interruption of the current flowing in the primary circuit Ts1. This then results in a transfer of the residual energy from the transformer Ts to the dielectric-barrier discharge device 20. The dielectric-barrier discharge device 20 thus imposes, through the step-up transformer Ts, a drop in the potential of the cathode of the diode D1 during a time t5, until reaching the value zero, value at which the diode D1 switches to a passing state again and imposes the polarisation of the primary circuit Ts1 at a voltage Vs. This is then followed by the phase of demagnetisation for a time tdem (FIGS. 6a and 6b), as indicated in the preceding point.

Following the demagnetisation of the magnetic core of the step-up transformer Ts, the current I(d1) (FIGS. 5b and 6b) is cancelled in the primary circuit, and the system constituted of the diode D1, of the step-up transformer Ts and of the dielectric-barrier discharge device 20 thus remains in a stationary state. Absorbed oscillations of the voltage V(dbd) between the dielectric-barrier discharge device 20, and the inductor of the secondary circuit Ts2 can however subsist.

Different strategies for controlling the controlled switch T1 for the production and the maintaining of a dielectric-barrier discharge in the device 20 shall now be described.

Such as mentioned hereinabove, certain switching modes seem more favourable than others for producing and maintaining a dielectric-barrier discharge. Also, it may seem preferable, in order to maintain the discharge, to control the closing of the controlled switch T1 when the voltage Vkd1 is negative, or when the voltage at the node N is negative, which is equivalent from the standpoint of the control strategy.

Three strategies for controlling the controlled switch T1 shall now be described.

The electrical pulse generator 10 can be provided with a control module 60 of the controlled switch T1. More particularly, the control module 60 can be suitable for generating a control signal Sc intended to control the opening and the closing of the controlled switch T1.

A first strategy referred to as "PWM control strategy" can be applied.

The first strategy comprises controlling the controlled switch via a pulse width modulation control logic (PWM). This first strategy can be implemented by the control module 60. More particularly, the control module 60 can comprise PWM logic controller of which the implementation is known to those skilled in the art. The PWM logic control signal is represented by timeslot functions in FIGS. 5b and 6b. However, when the current passing through the inductor Lstock (I(Lstock)) increases linearly during the closing of the controlled switch T1, a succession of fixed-length control timeslots will theoretically give rise to an increasingly substantial current at each timeslot (such as shown in FIGS. 5b and 6b over 2 timeslots).

In reality, the higher the current max is, the more the dielectric-barrier discharge absorbs energy, which can in the end lead to an equilibrium and a permanent operation.

An implementation of the topology indicated in FIG. 2, provided with an input filter in parallel with the DC voltage source 20 (Vs) formed by a 20 µF capacitor, with a PWM control mode provided a stable permanent operation on a dielectric-barrier discharge device 20 comprising a discharge lamp (described in the document [4] mentioned at the end of the description). The parameters of the converter 10 are provided in table 1.

TABLE 1

| Parameter | Value | Unit |
|---|---|---|
| DC voltage source 20 | Voltage between 10 V and 100 V | V |
| Inductor Lstock | Inductance between 15 and 50 | µH |
| Diodes D1 and D2 | Schottky diode | |
| Controlled switch T1 | Mosfet N | |
| Transformer Ts | Can include a ferrite core, and deliver a voltage between 1000 V and 8000 V at the output terminals of its secondary circuit. | |
| PWM logic control | 100 kHz, 10% duty cycle | |

The dimensioning of the diodes D1, and D2, as well as of the transformer Ts is within the technical knowledge of the skilled in the art, and is therefore not described in detail in this application.

The advantage of the first strategy referred to as "PWM control strategy" is that it is simple to implement on the topology of the electrical pulse generator 10 according to the invention. Moreover, the PWM control strategy comprises two degrees of freedom for control, namely:
 the duty cycle that affects the value Imax,
 the frequency, which affects the average power injected into the dielectric-barrier discharge device.

A second strategy referred to as "Limited current control strategy" can also be applied.

The object of the limited current strategy comprises the controlling of the closing of the controlled switch T1 at a defined frequency, for example at the frequency of a clock H1, and the opening of said controlled switch T1 when the current passing through the inductor Lstock exceeds a reference current value Iref (for example the value Imax mentioned hereinabove). This method makes it possible to guarantee a stable operation.

Thus, in order to implement the limited current control strategy, it can be interesting to provide the control module 60 (shown in FIG. 7) with a means for comparing 61 the current Istock passing through the inductor Lstock with the reference current Iref. Thus, when the current Istock is greater than the current Iref, the control module 60 is suitable for generating a control signal Sc for opening the controlled switch T1. The means for comparing 61 can receive the measurement of the current Istock from a current probe 61b.

Advantageously, the means for comparing 61 comprise a first comparator.

The term first comparator means a comparator suitable for differentiating between two analogue input magnitudes, and generating a logic output signal referred to as "high" or "low" according to the sign of said difference. Comparators are known to those skilled in the art, and therefore will not be described in detail in the description. In the framework of this invention, the signal at the output of the first comparator will be referred to as "high" if the current Istock is less than the reference current Iref, and it will be low in the opposite case.

Still advantageously, the control module 60 comprises a flip-flop of type D (hereinafter referred to as flip-flop D 70) that controls the controlled switch T1, and comprising an output Sc intended to send the control signal Sc to the controlled switch T1.

By definition, a flip-flop D 70 is a logic circuit that comprises a control input, noted as C, a data input, noted as D, and an output noted as Q. In operation, the input signal D is copied on the output Q on each rising edge of the input C. A flip-flop D can be provided with a SET and/or RESET input (noted as RST) that respectively imposes a "high" and "low" state of the output Q regardless of the state of the inputs D 72 and C 71. The controlled input (input C 71) and the data input (input D 72) will retain these definitions all throughout the description.

In the framework of this invention, the term high state at the level of the output Sc of the flip-flop D 70 means a state intended for controlling the closing of the controlled switch T1. Similarly, the term low state at the level of the output Sc of the flip-flop D 70 means a state intended for controlling the opening of the controlled switch T1.

In the context of this invention, the signal imposed on the input D 72 and RST# (RESET, reverse logic) of the flip-flop D 70 is considered to be high if the current Istock is less than the reference current Iref, and the signal will be low in the opposite case.

Advantageously, an external control signal, for example a clock signal H1 with timeslot, is sent to the input C 71 of the flip-flop D 70.

A rising edge of the clock signal H1 with timeslot corresponds, in the framework of this invention, to a high state imposed on the input C 71 of the flip-flop D 70. Thus, when a high state is imposed on the input C 71, a control signal Sc for closing is sent by the flip-flop D 70 to the controlled switch T1, with the condition that the signal imposed on the input RST# (identical to the one imposed on the input D 72) is "high".

Figure 8A:
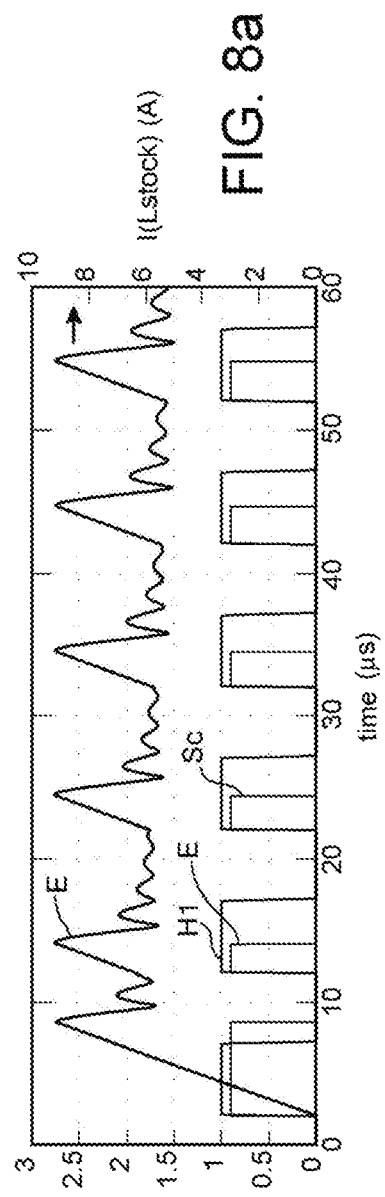
FIG. 8a is a graphical representation, of a digital simulation of the operation of the electrical pulse generator according to the invention, in the context of a control strategy with limited current, with the graph showing the current Istock passing through the inductor Lstock (right vertical axis), the clock signal H1 (left vertical axis) and the control signal Sc generated by the flip-flop D (left vertical axis) and sent to the controlled switch T1, as a function of time (horizontal axis)
Figure 8B:
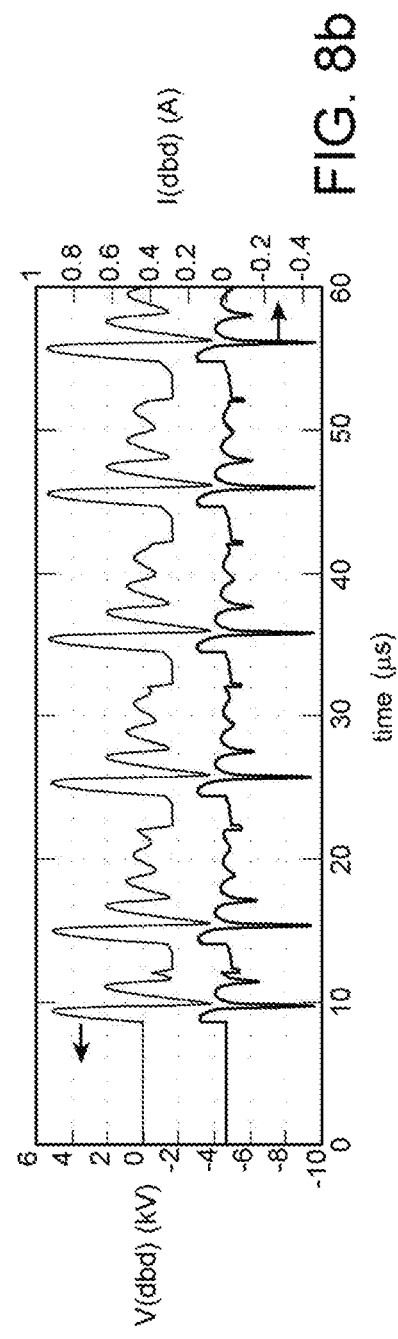
FIG. 8b is a graphical representation, of a digital simulation of the operation of the electrical pulse generator according to the invention, in the context of a control strategy with limited current, with the graph showing the current I(dbd) (right vertical axis) passing through the dielectric-barrier discharge device, as well as the voltage V(dbd) (left vertical axis) at the terminals of said device, as a function of time (horizontal axis)

FIGS. 8*a* and 8*b* show the oscillograms obtained by digital simulation of the electrical pulse generator 10 controlled by the control module (60), while FIG. 8*c* shows the oscillograms obtained by an experimental implementation of the electrical pulse generator 10 controlled by the control module 60. More particularly, FIG. 8*a* shows the current Istock passing through the inductor Lstock, the clock signal H1 and the control signal Sc generated by the flip-flop D 70 and sent to the controlled switch T1. The FIGS. 8*b* and 8*c* show the current I(dbd) passing through the dielectric-barrier discharge device 20, as well as the voltage V(dbd) at the terminals of said device, respectively in the framework of a digital simulation and an experimental implementation of the invention.

Note that the oscillograms obtained by digital simulation and experimentally are very similar.

Note that each timeslot of the control signal Sc corresponds to a pulse of the current Istock (for example, the pulse indicated by the mark E in FIG. 8*a*). The current pulse Istock is followed by a discharge in the dielectric-barrier discharge device 20 that can be identified in FIG. 8*b* by a strong variation in the amplitude of the voltage V(dbd) and of the current I(dbd) measured at the terminals of said device 20.

Figure 7:
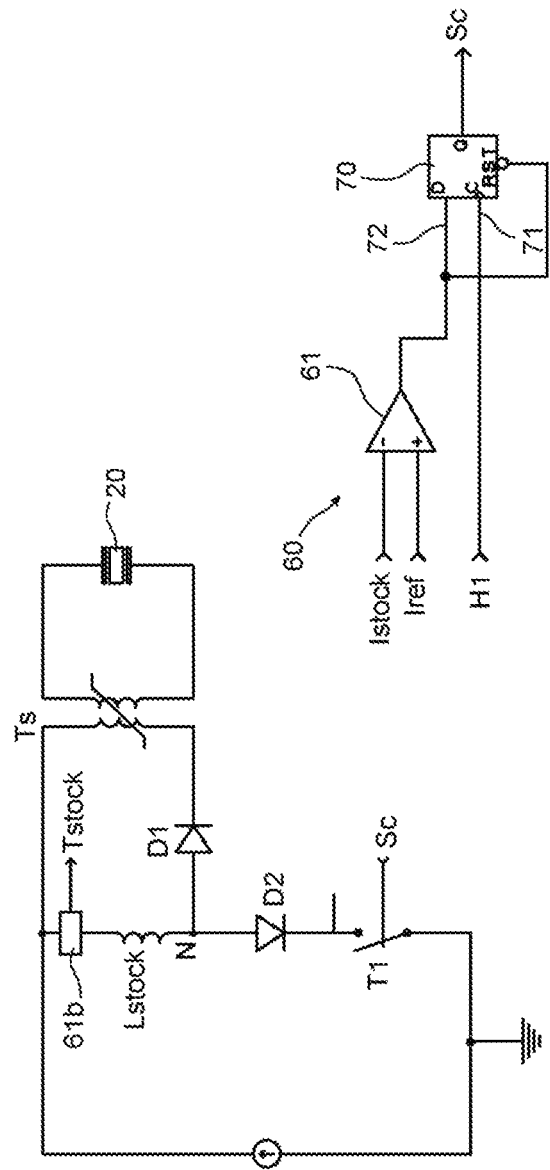

An implementation of the topology indicated in FIG. 7, provided with an input filter in parallel with the DC voltage source 30 (of voltage Vs). The input filter comprises a 20 μF capacitor, a surge suppression diode in parallel with the inductor Lstock.

The parameters of the converter 10 are provided in table 2.

TABLE 2

| Parameter | Value | Unit |
| --- | --- | --- |
| DC voltage source 20 | Tension between 10 V and 100 V | V |
| Inductor Lstock | Inductance between 15 and 50 | μH |

TABLE 2-continued

| Parameter | Value | Unit |
| --- | --- | --- |
| Diodes D1, D2 | Schottky diode | |
| Controlled switch T1 | Mosfet N | |
| Transformer Ts | Can include a ferrite core, and deliver a voltage between 1000 V and 8000 V at the output terminals of its secondary circuit. | |
| Clock signal H1 | 100 kHz | |

The limited current strategy allows for a stable permanent operation and is perfectly adapted to a use at moderate power. It allows for a broad range of gradation since by maintaining a nominal current setting and by lowering the frequency of the clock signal H1, it is possible to significantly reduce the power injected into the dielectric-barrier discharge device 20 without causing the extinction thereof.

A third strategy referred to as "optimum power strategy", which makes it possible to guarantee the closing of the controlled switch T1 for a negative voltage V(kd1), shall now be described.

Thus, in order to implement the optimum power strategy, the control module 60 (shown in FIG. 9) uses the means for comparing 61 of the control module 60 which makes it possible to implement the limited current control strategy.

Advantageously, the means for comparing 61 comprise a first comparator.

Figure 9:
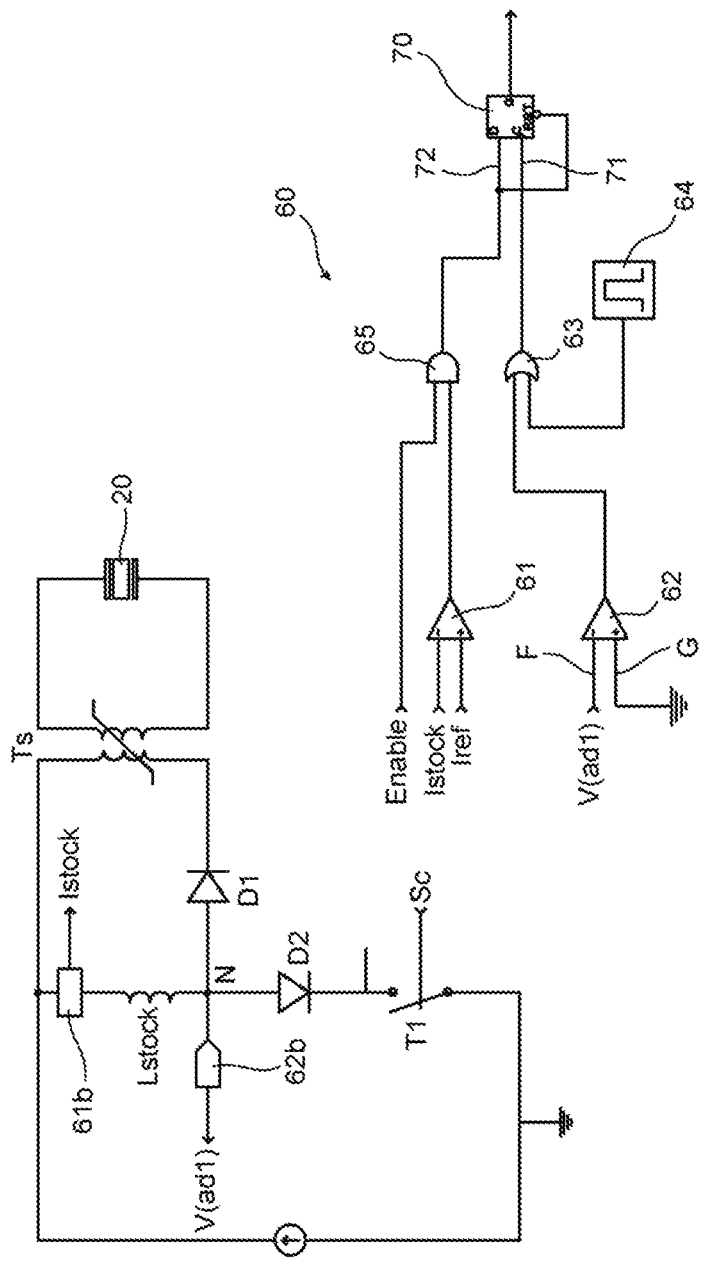

Still advantageously, the control module 60 comprises a flip-flop D 70 that controls the controlled switch T1, and comprising an output Sc intended to send the control signal Sc to the controlled switch T1 (FIG. 9).

A flip-flop D 70 is a logic circuit that includes a control input, noted as C, a data input, noted as D, and an output noted as Q. During operation, the input signal D (at the level of the input D 72) is copied on the output Q on each rising edge of the signal imposed on the input C 71. A flip-flop D can be provided with a SET and/or RESET input that respectively imposes a "high" and "low" state of the output Q, regardless of the state of the inputs D 72 and C 71.

In the context of this invention, the signal imposed on the input D 72 of the flip-flop D 70 is considered to be high if the current Istock is less than the reference current Iref, and the signal will be low in the opposite case.

The control module 60 can, furthermore, comprise a means for determining the sign of the voltage 62 at the node N (noted V(ad1)), the control module 60 being suitable for generating a control signal Sc that controls the closing of the controlled switch T1 when the voltage V(ad1) at the node N is negative.

The means for determining the sign of the voltage 62 can receive the measurement of the voltage V(ad1) from a voltage probe 62*b*.

The means for determining the sign of the voltage 62 is, for example, a second comparator.

More particularly, the second means for comparing is suitable for measuring the difference between the value of the voltage V(ad1) and the earth potential. Thus, during operation, the measurement of the voltage V(ad1) is injected at the level of a first input F of the second comparator, while a second input G of the second comparator is connected to the earth.

Advantageously, the means for determining the sign of the voltage 62 is connected to the input C 71 of the flip-flop D 70, the means for determining the sign of the voltage 62 being suitable for sending a high state to the input C 71 of the flip-flop D 70 when the voltage V(ad1) at the node N is negative. Recall that, in this respect, a flip-flop D 70 for which its input C 71 is on a rising edge, the output Sc copies the state of its input D 72.

Thus, if the current Istock is greater than the current Iref, the signal on the input RST of the flip-flop D 70 impose the output Q at the low state.

On the contrary, if the current Istock is less than the current Iref, Q switches to a "high" state at the first rising edge of C 71, i.e. when the voltage at the node N switches to negative.

Advantageously, the control module 60 can include a logic OR gate 63 interposed between the means for determining the sign of the voltage 62 and the input C 71 of the flip-flop D 70. The output of the means for determining the sign of the voltage 62 is thus connected to an input of the logic OR gate 63. A priming generator 64 can also be connected to a second input of the logic OR gate 63, the priming generator 64 being adapted to generate the starting of the electrical pulse generator 10.

The term logic OR gate means a logic circuit that when at least one of its two inputs is in a high state, generates a high signal at its output. It generates a low state in the opposite case.

The priming generator can be a clock. The priming signal (a high signal at the input of the logic OR gate 63) can be required in case of absence of a negative voltage signal V(kd1).

Still advantageously, the control module 60 can also comprise a logic AND gate 65 interposed between the means for comparing 61 and the input D 72 of the flip-flop D 70. The logic AND gate comprises a first input supplied by the means for comparing 61 and a second input supplied by an ENABLE signal. The logic AND gate 65 supplies the input D 72 of the flip-flop D 70, the logic AND gate 65 being suitable for sending a high signal to the input D 72 when the current Istock is less than the reference current Iref and the ENABLE signal is also high.

The term logic AND gate means a logic circuit that when all of its inputs are simultaneously in a high state, generates a high signal at its output. It generates a low state in the opposite case.

A "low" ENABLE signal makes it possible to control the stopping of the electrical pulse generator 10. Indeed, since the discharge in the dielectric-barrier discharge device 20 is self-maintained by the operating mode of the control module 60 and of the electrical pulse generator, the user, via a "low" ENABLE control signal, can control the stopping of the discharges.

The ENABLE signal can be a starting signal (for the electrical pulse generator 10). The generator 64 can cooperate with the priming signal, and send a pulse (a high signal) to the input of the OR gate 63 to which it is connected after a period d starting from the rising edge of the starting signal.

Figure 11:
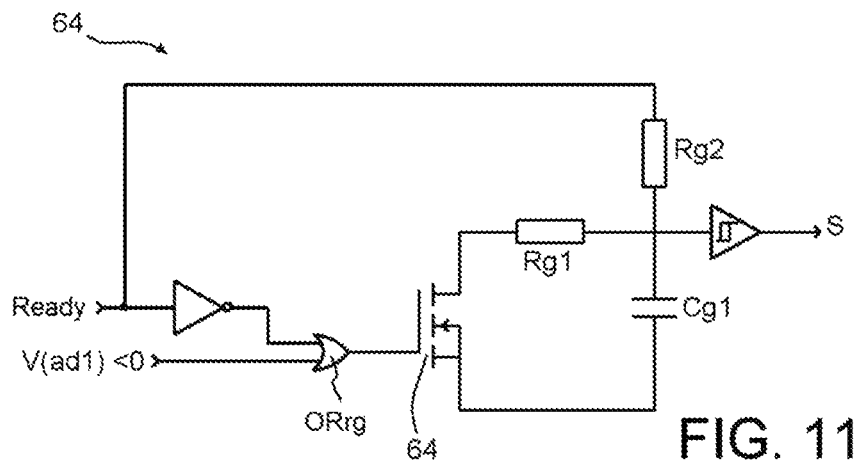
FIG. 11 shows an example of a priming signal generator.

FIG. 11 shows an example of a priming signal generator 64. The latter can be carried out with commercial integrated circuits, or with discrete components.

The priming signal generator 64 of FIG. 11 can include two inputs intended to receive, respectively, the signal emitted by the output of the OR gate 65, and the sign of the voltage V(ad1). The priming signal generator 64 can, furthermore include two resistors Rg1 and Rg2, a capacitor Cg1.

Finally, the priming signal generator 64 comprises an output S intended to be connected to an input of the OR gate 63.

Figure 10C:
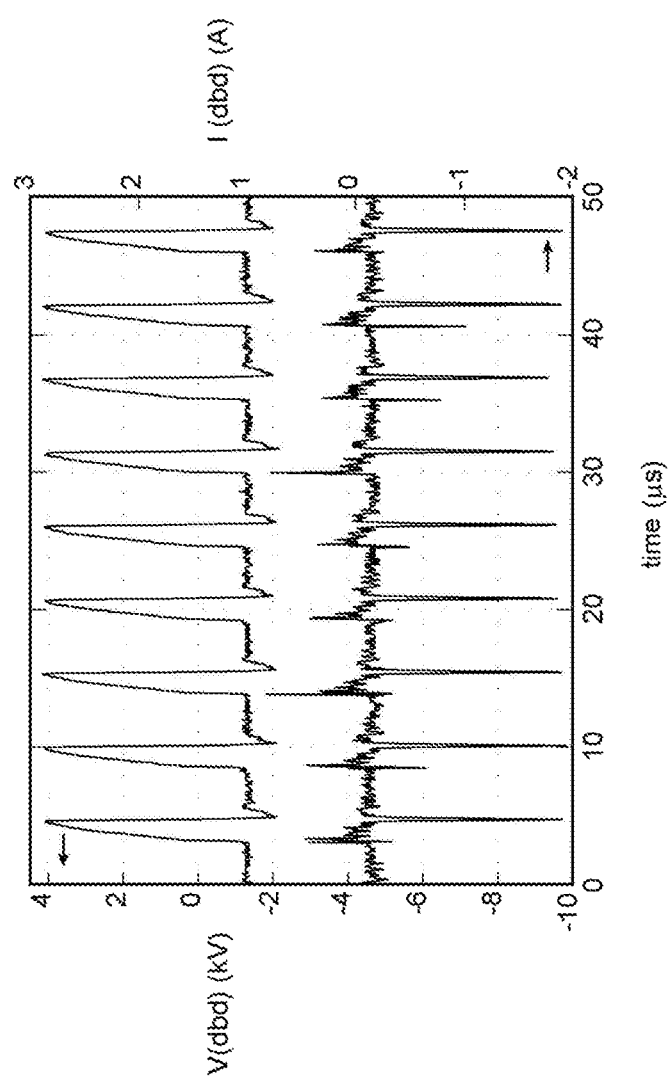
FIG. 10c is a graphical representation, of an experimental implementation of the electrical pulse generator according to the invention, in the context of an optimum power control strategy, with the graph showing the current I(dbd) (right vertical axis) passing through the dielectric-barrier discharge device, as well as the voltage V(dbd) (left vertical axis) at the terminals of said device, as a function of time (horizontal axis)

FIGS. 10a and 10b show the oscillograms obtained by digital simulation of the control module (60), while FIG. 10c shows the oscillograms obtained by an experimental implementation of the electrical pulse generator controlled by the control module 60. More particularly, FIG. 10a shows the current Istock passing through the inductor Lstock, the ENABLE signal and the control signal Sc generated by the flip-flop D 70 and sent to the controlled switch T1. FIGS. 10b and 10c shows the current I(dbd) passing through the dielectric-barrier discharge device 20, as well as the voltage V(dbd) at the terminals of said device, respectively in the framework of a digital simulation and of an experimental implementation of the invention.

Note that the oscillograms obtained by digital simulation and experimentally are very similar.

Note that each timeslot of the control signal Sc corresponds to a pulse of the current Istock (for example, the pulse indicated by the mark E in FIG. 10a). The current pulse Istock is followed by a discharge in the dielectric-barrier discharge device 20 that can be identified in FIGS. 10b and 10c by a strong variation in the amplitude in the voltage V(dbd) and in the current I(dbd) measured at the terminals of said device 20.

An implementation of the topology indicated in FIG. 9, is furthermore provided with the following elements:
- an input filter in parallel with the DC voltage source 30, the filter comprising a 20 µF capacitor,
- a surge suppression diode in parallel with Lstock,
- a 470 pF capacitor between the anode of the diode D1 and the earth in order to eliminate the voltage peaks at the terminals of the inductor Lstock due to the leakage inductance of the step-up transformer Ts that can be saturated.

The parameters of the converter 10 are provided in table 3.

TABLE 3

| Parameter | Value | Unit |
| --- | --- | --- |
| DC voltage source 30 | Tension between 10 V and 100 V | V |
| Inductor Lstock | Inductance between 15 and 50 | µH |
| Diodes, D1, D2 | Schottky diode | |
| Controlled switch T1 | Mosfet N | |
| Transformer Ts | Can include a ferrite core, and deliver a voltage between 1000 V and 8000 V at the output terminals of its secondary circuit | |
| Rg1 | 10 | Ω |
| Rg2 | 1.7 | kΩ |
| Cg1 | 20 | nF |

In certain cases, in particular when the dielectric-barrier discharge device consumes a large portion of the energy that is transferred to it, the voltage V(ad1) falls below its stationary value (Vs) at the end of the sequence 3, without however becoming negative. In this case, it is possible to implement an alternative of this optimum power control strategy which consists in applying a positive polarisation voltage Vpol on the second voltage comparator in place of the earth. In this case, the signal generated will be the difference between the voltage V(ad1) and the polarisation voltage Vpol ("V(kd1)<Vpol"). This makes it possible to provide for the closing of the controlled switch T1, even if V(ad1) does not take a negative value. In this case, the switching will not be done with a zero voltage, but the voltage Vpol representing a voltage less than Vs, the conditions for forced switching will remain within an acceptable limit for the controlled switch T1.

REFERENCES

[1] U. Kogelschatz and al., "Dielectric-Barrier Discharges. Principle and Applications", Journal de Physique IV Colloque, 1997, 07 (C4), pp. C4-47-C4-66,
[2] EP0781078B1,
[3] Electronics Engineer's Reference Book" published by F. F. Mazda, 2013 ISBN 1483161064,
[4] Hubert Piquet, Sounil Bhosle, Rafael Diez, and Michael V. Erofeev, "Pulsed Current-Mode Supply of Dielectric Barrier Discharge Excilamps for the Control of the Radiated Ultraviolet Power", IEEE Transactions on Plasma Science, vol. 38, no. 10, October 2010.

The invention claimed is:

1. Electrical pulse generator intended to power a dielectric-barrier discharge device, the generator comprising an inductor intended to store energy that is delivered, during a charge phase, by a DC voltage source to two power supply terminals of the generator, and to transfer said energy to the dielectric-barrier discharge device during a discharge phase by the intermediary of a step-up transformer, the generator further comprising:
   an arrangement of a first and of a second circuits in series that are connected at a node N of the generator,
   the first circuit comprising two parallel branches, one of the two branches comprising the inductor, and the other branch comprising, in series, a diode connected by its anode to the node N, and by its cathode to the primary circuit of the step-up transformer, the secondary circuit of the step-up transformer, the secondary circuit of the step-up transformer being intended to be connected to the dielectric-barrier discharge device,
   the second circuit comprising a controlled switch of which the closing and the opening control, respectively, the charge and discharge phases.

2. Generator according to claim 1, wherein the second circuit further comprises a diode electrically connected in series with the controlled switch, and connected by its anode to the node N.

3. Generator according to claim 1, wherein the step-up transformer also comprises a magnetic core, the electrical pulse generator further comprises the dielectric-barrier discharge device, said dielectric-barrier device comprising a gas that is suitable for generating a dielectric-barrier discharge when a voltage V, greater than an operating voltage $V_D$ of the dielectric-barrier discharge device, is imposed on said device, in such a way that the dielectric-barrier discharge generates a first variation in the magnetic flux, predetermined by the operating voltage $V_D$, through the magnetic core, the magnetic core being dimensioned to magnetically saturate when a variation in the magnetic flux, greater than the first variation in the magnetic flux, passes through it.

4. Generator according to claim 1, wherein the generator further comprises a control module suitable for generating a control signal Sc intended to control the opening and the closing of the controlled switch.

5. Generator according to claim 4, wherein the control module comprises means for comparing a current Istock passing through the inductor with a reference current Iref, the control signal of the control module controlling the opening of the controlled switch when the current Istock is greater than the current Iref.

6. Generator according to claim 5, wherein the means for comparing comprise a first comparator.

7. Generator according to claim 5, wherein the control module comprises a flip-flop D comprising an output intended to send the control signal Sc to the controlled switch.

8. Generator according to claim 4, wherein the control module is, furthermore, suitable for generating a control signal Sc for closing the controlled switch when an external control signal is received, advantageously, the external control signal is a clock signal H1 with timeslot, and a control signal Sc for closing is generated on each rising edge of the clock signal H1.

9. Generator according to claim 8, wherein the control module comprises a flip-flop D comprising an output intended to send the control signal Sc to the controlled switch, and wherein the external control signal is sent to an input C of the flip-flop D, the comparison of the current Istock with the reference current Iref is sent to the input D of the flip-flop D.

10. Generator according to claim 4, wherein the control module comprises, furthermore, a means for determining the sign of the voltage at the node N, the control module being suitable for generating a control signal Sc that controls the closing of the controlled switch when the voltage at the node N is negative.

11. Generator according to claim 10, wherein the means for determining the sign of the voltage is a second comparator.

12. Generator according to claim 10, wherein the control module comprises a flip-flop D comprising an output intended to send the control signal Sc to the controlled switch, wherein the means for determining the sign of the voltage is connected to the input C of the flip-flop D, the means for determining the sign of the voltage being suitable for sending a high state to the input C of the flip-flop D when the voltage V at the node N is negative.

13. Generator according to claim 12, wherein the control module comprises a logic OR gate interposed between the means for determining the sign of the voltage and the input C of the flip-flop D, the output of the means for determining the sign of the voltage being connected to an input of the logic OR gate, and a priming generator being connected to a second input of the logic OR gate, the priming generator being suitable for generating a so-called "high" state at the input of the logic OR gate.

14. Generator according to claim 13, wherein the control module further comprises a logic AND gate interposed between the means for comparing and the input D of the flip-flop D, the logic gate comprising a first input supplied by the means for comparing and a second input supplied by an ENABLE signal, the logic AND gate supplying the input D of the flip-flop D, the logic AND gate being suitable for sending a high signal to the input D when the current Istock is less than the reference current Iref and the ENABLE signal is high also, and a low ENABLE signal that makes it possible to stop the electrical pulse generator.

* * * * *

UNITED STATES PATENT AND TRADEMARK OFFICE
CERTIFICATE OF CORRECTION

PATENT NO. : 10,462,889 B2
APPLICATION NO. : 16/326740
DATED : October 29, 2019
INVENTOR(S) : Sounil Bhosle Page 1 of 1

It is certified that error appears in the above-identified patent and that said Letters Patent is hereby corrected as shown below:

In the Specification

Column 11, Line 60, "current max" should read -- current Imax --

Signed and Sealed this
Thirteenth Day of October, 2020

Andrei Iancu
*Director of the United States Patent and Trademark Office*